United States Patent
Bernier

[11] Patent Number: 5,828,089
[45] Date of Patent: Oct. 27, 1998

[54] FULL PROTECTION COMPONENT FOR A SUBSCRIBER LINE INTERFACE CIRCUIT

[75] Inventor: Eric Bernier, Mettray, France

[73] Assignee: SGS-Thomson Microelectronics S.A., Saint Genis, France

[21] Appl. No.: 641,676

[22] Filed: May 1, 1996

[30] Foreign Application Priority Data

May 12, 1995 [FR] France ................................. 95 05877

[51] Int. Cl.[6] .................... H01L 29/74; H01L 31/111; H01L 23/62
[52] U.S. Cl. ..................... 257/173; 257/355; 257/358
[58] Field of Search .................... 257/173, 174, 257/355, 358, 362, 363

[56] References Cited

U.S. PATENT DOCUMENTS 4,847,724  7/1989  Renous ........................... 361/91
5,304,823  4/1994  Byatt ............................. 257/177

FOREIGN PATENT DOCUMENTS 0 388 022  9/1990  European Pat. Off. .
A-0 388 022  9/1990  European Pat. Off. ......... H04M 3/18
A-0 600 810  6/1994  European Pat. Off. ......... H01L 27/02
0 600 810  8/1994  European Pat. Off. .

OTHER PUBLICATIONS

French Search Report from French Patent Application 95 05878, filed May 12, 1995.

*Primary Examiner*—Wael Fahmy
*Attorney, Agent, or Firm*—Wolf, Greenfield & Sacks, P.C.

[57] ABSTRACT

A monolithic component for protecting a subscriber line interface circuit includes, in an N-type substrate, whose bottom surface is coated with a first uniform metallization, first and second portions separated by a P-type isolation wall. The first portion includes two vertical diodes having a common cathode corresponding to the bottom surface of the substrate, two vertical transistors having a common collector and a common base, the collectors corresponding to the bottom surface of the substrate. The second portion includes two sets each including a pair of head-to-tail parallel-connected vertical thyristors and a pair of head-to-tail parallel-connected vertical zener diodes for controlling the conduction of these thyristors.

18 Claims, 4 Drawing Sheets

FULL PROTECTION COMPONENT FOR A SUBSCRIBER LINE INTERFACE CIRCUIT

BACKGROUND OF THE INVENTION

1. Field of the Invention

The present invention relates to protection devices for subscriber line interface circuits (SLIC). There is a need for specific protection for subscriber line interface circuits which are connected to telephone lines that may be impaired by various spurious phenomena. Some phenomena can be particularly damaging, for example, lightning or a short between the telephone line and the mains.

2. Discussion of the Related Art

As represented in FIG. 1, lines T and R of a telephone line, usually biased at negative voltages (for example −50 and −4 volts, respectively), are generally connected to the input of a SLIC through line pick-up relays 2. The SLIC includes various integrated circuits and is particularly sensitive to the occurrence of electrical overloads. Thus, in the prior art, several protection circuits for SLICs have been developed.

Generally, protection devices illustrated in blocks I, II and III of FIG. 1, are used separately or in combination.

The protection device I is disposed upstream from the line pick-up relays 2. Device I comes into play when the line pick-up relays are in ringing mode and must permit the flowing of relatively high ringing currents. For this purpose, this device generally comprises bidirectional protection components adjusted to values of approximately 250 volts. The protection components withstand overloads higher than 30 A for a 10/1000-$\mu$s standardized overload wave.

The protection device II is disposed between the line pick-up relays and the SLIC. The SLIC can be actuated only once the line is connected, i.e., when the relays are in the speaking mode. The protection level of device II is usually adjusted between 50 and 80 volts. Furthermore, this component must be adapted to withstand high overloads such as those caused by lightning or by the line contacting a power supply line.

In blocks I and II, conventional protection devices are represented. Many variants of these protection devices can be used. Since devices I and II should be designed to be capable of withstanding very high overloads, they cannot presently reach, at moderate costs, the rapidity requirements for the present SLIC integrated circuits.

As a consequence, in addition to devices I and II, a fast third level of close protection is generally provided, i.e., the device III of FIG. 1. Device III is disposed close to the inputs of the SLIC. The rapidity requirement for an SLIC circuit can be met because device III is not intended to withstand high overloads. Rather, it withstands only the fast rising initial portion of an overload. In fact, as soon as device III starts to operate, the resistor connected in series with the line upstream from device III causes the line voltage to increase and one of the devices I and II is triggered. Generally, it is assumed that device III has only to withstand a few tens of an ampere for periods shorter than 20 $\mu$s.

The device III of FIG. 1 includes two diodes having their anodes connected to the conductors of the line and their cathodes both connected to ground, and two diodes having their cathodes connected to the conductors of the line and their common anode connected to the battery voltage available from the SLIC. Each of these diodes is designed to operate in the forward direction. Thus, very fast diodes with low peak-on overvoltages are desired. If a positive overvoltage occurs at one line T or R (which are normally negatively biased), the overvoltage is absorbed by the diodes connected to ground. If a voltage lower than the battery voltage occurs at one of the lines, it is discharged down to the battery voltage $V_{BAT}$ (usually a negative voltage of approximately −48 volts).

In the prior art, a device equivalent to the protection device illustrated in block III of FIG. 1, and achieved in the form of a monolithic component on a single semiconductor substrate is not available. It can be seen that this circuit includes two diodes connected by their anodes and two additional diodes connected by their cathodes. This unavoidably creates a monolithic circuit having a combination of vertical diodes with lateral diodes, which slows the response time of the device. Furthermore, monolithic components ensuring all the above-mentioned protection functions are not known.

SUMMARY OF THE INVENTION

The present invention aims at manufacturing in the form of a monolithic circuit all the protection devices of a SLIC without impairing the characteristics of these circuits.

Thus, the present invention selects two specific protection devices and combines them to provide a monolithic component grouping all the protection functions useful for a SLIC. The invention more particularly uses a first protection circuit disposed at the position of block I, combining a current protection and a voltage protection thus avoiding the use of block II, with a specific close protection circuit III such as represented hereinafter in FIG. 2.

The invention more particularly provides a monolithic component for protecting a SLIC including, in an N-type substrate, whose bottom surface is coated with a first uniform metallization, two portions separated by a P-type isolation wall. In these two portions, the first portion includes two vertical diodes having a common cathode corresponding to the bottom surface of the substrate, two vertical transistors having a common collector and a common base, the collectors corresponding to the bottom surface of the substrate. The second portion includes two sets each including a pair of head-to-tail parallel-connected vertical thyristors and a pair of head-to-tail parallel-connected vertical zener diodes for controlling the conduction of these thyristors.

According to an embodiment of the present invention, the first portion includes a low-doped N-type semiconductor substrate, whose bottom surface includes a highly doped layer coated with a first metallization, and on the side of the upper surface of the substrate, first and second highly-doped P-type wells, a third low-doped P-type well in which are formed first and second N-type regions and a P-type region. A second metallization connects the first well to the first N-type region. A third metallization connects the second well to the second N-type region. A fourth metallization is integral with the P-type region.

According to an embodiment of the invention, the well is surrounded with an N-type ring.

According to an embodiment of the present invention, the second portion includes first and second upper surface metallizations designed to be connected to the terminals of a resistor; first and second head-to-tail parallel thyristors connected between the first and third metallizations, the second metallization corresponding to the gate of the first and second thyristors; and a first avalanche diode having a first polarity between the second and third metallizations, and a second avalanche diode having a reverse polarity between one of the first and second metallizations and the third metallization, the first and second diodes being disposed so that the conduction of one of them causes the conduction of one of the thyristors.

According to an embodiment of the present invention, the second portion includes a substrate of a first conductivity type; a first region of the second conductivity type formed in the upper surface of the substrate; a second region of the second conductivity type formed in the lower surface of the substrate; a third region of the first conductivity type formed substantially in one half of the surface of the first region; a fourth region of the first conductivity type formed substantially in one half of the surface of the second region and substantially complementing the third region; a fifth region of the first conductivity type formed in a portion of the first region over a portion of the fourth region; a sixth highly-doped region of the first conductivity type formed at the interface between the first region and the substrate; a seventh highly-doped region of the first conductivity type formed at the interface between the second region and the substrate facing at least one portion of the fourth region; a first metallization coating the third region and practically all the first region; a second metallization coating a portion of the first region near the third and the fifth regions; and a third metallization coating the second and fourth regions.

The foregoing and other objects, features, aspects and advantages of the invention will become apparent from the following detailed description of illustrative embodiments of the present invention when taken in conjunction with the accompanying drawings.

DETAILED DESCRIPTION

Figure 1:
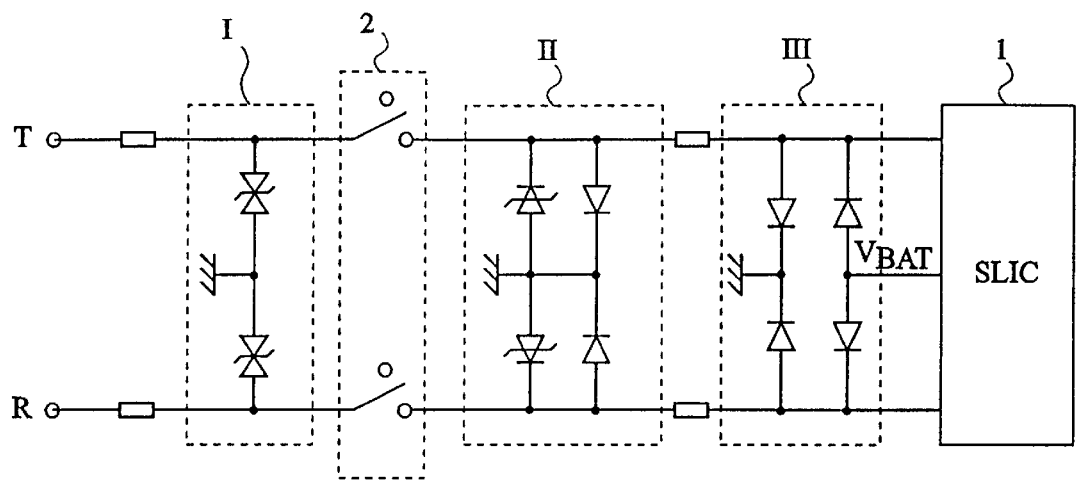
FIG. 1 represents a protection circuit diagram of a SLIC.
Figure 2:
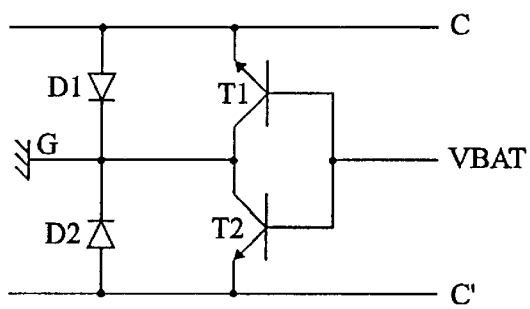
FIG. 2 represents a circuit in the form of a specific close protection device for a SLIC.

As represented in FIG. 2, to perform the function of device III of FIG. 1, an embodiment of the present invention uses a close protection device for a SLIC a device which includes two diodes D1, D2 and two transistors T1, T2. The diodes D1, D2 are connected to the input terminals C and C' of the SLIC by their respective anodes, and are connected together by their cathodes to ground G. The respective emitters of the NPN-type transistors are connected to terminals C and C'. The collectors of the transistors are both connected to ground G. The transistor bases are both connected to voltage $V_{BAT}$. The circuit of FIG. 2 is further described in French patent application 95/05878 which is herein incorporated by reference.

This structure is particularly advantageous in that each of the transistors triggers when the voltage at its emitter becomes lower than the negative voltage $V_{BAT}$ and the overload current is then drawn not from voltage $V_{BAT}$ but from ground. Thus, the current surge on the voltage source $V_{BAT}$ corresponds to the overload intensity divided by the gain of the transistors. This is advantageous because voltage $V_{BAT}$ available from the SLIC is a voltage occurring across a capacitor and present standards demand minimal current surges from $V_{BAT}$.

Thus, this embodiment of the present invention is based on the selection of the circuit illustrated in FIG. 2 and implements this circuit in the form of a monolithic component while maintaining the following advantages:

fast, low peak-on voltage diodes D1 and D2, fast switch-on transistors T1 and T2, high-gain (50–150) transistors T1 and T2, for limiting the current extracted from source $V_{BAT}$, transistors T1 and T2 having a high emitter-base breakdown voltage (approximately 100 V), adapted to withstand the reverse nominal voltage, transistors T1 and T2 having a low resistance at the conductive state, adapted to prevent the component from heating and being possibly destroyed by overvoltages.

Figure 3:
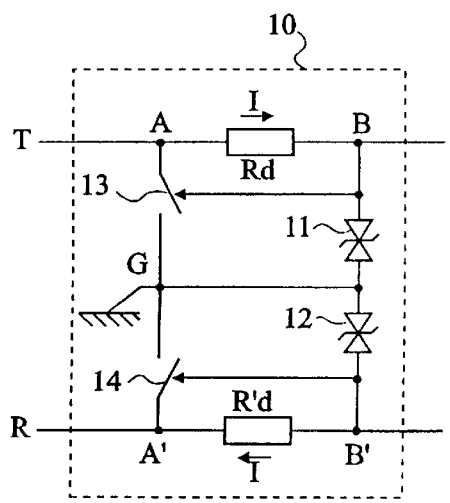
FIG. 3 represents a block diagram of a close protection device of a SLIC performing the functions of blocks I and II of FIG. 1.
Figure 4:
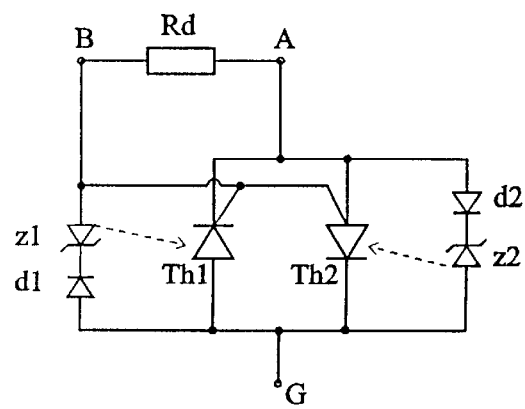
FIG. 4 is a circuit illustrating an embodiment of a half-circuit of FIG. 3.

As represented in FIGS. 3 and 4, an embodiment of the present invention uses, to perform the function of devices I and II, a single protection device 10 such as described in French patent application 94/05925 of May 9, 1994 of the applicant, which is herein incorporated by reference. The device 10 ensures both overvoltage protection, active when the relays 2 illustrated in FIG. 1 are off, represented by way of example in FIG. 3 by two Shockley diodes 11 and 12, and an overcurrent protection, active when the relays 2 are on. Device 10 is placed upstream from the relays, like block I of FIG. 1, and is connected between terminals A and B that are disposed on both sides of a detection resistor Rd connected in series to line T, and between terminals A' and B' disposed on both sides of a detection resistor R'd connected in series to line R. The possible overloads are drawn toward a terminal G connected, for example, to ground. Upon detection of an overcurrent, switches 13 and 14, respectively, disposed between terminals A and G and between terminals A' and G, are turned-on. In addition, the conduction of the protection device 11 or 12 also immediately causes the corresponding switch 13 or 14 to switch-on. It should be noted that an advantage of the provision of an overcurrent protection device is to prevent overcurrents from occurring in switches 2 when they are turned-on.

Figure 4A:
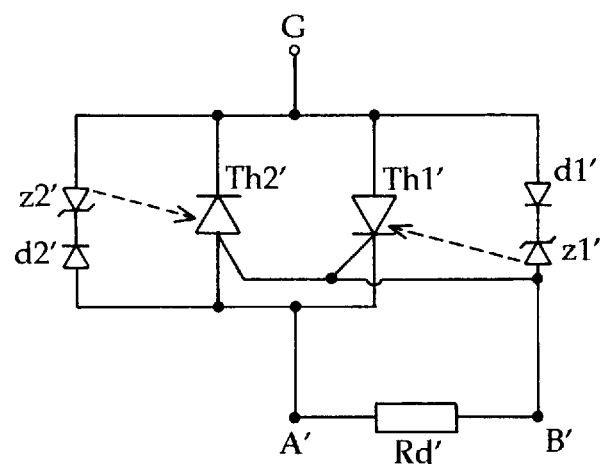
FIG. 4a is a circuit illustrating an embodiment of the other half circuit not shown in FIG. 4.

FIG. 4 is a circuit representing an equivalent circuit of one half of the protection device 10. FIG. 4 represents only the elements provided between terminals A, B and G. These elements are duplicated across terminals A', B', and G, as shown in FIG. 4a. Across terminals A and B, two thyristors Th1 and Th2 which are a cathode gate thyristor and an anode gate thyristor, respectively, are head-to-tail parallel-connected. The gates are connected together to terminal B. Thus, when a current flows through resistor Rd, a potential difference occurs between the gate and the corresponding main electrode coupled to terminal 4 and causes the conduction of thyristor Th1 or Th2 depending upon the direction of the current. The thyristor having the suitable polarity becomes conductive when the potential at its gate differs from the potential at the corresponding main electrode by a value of approximately 0.7 volt. Resistor R will therefore be selected as a function of the value of current I for which the protection device should trigger in order that RxI is approximately 0.7 volt. Thus, for currents I ranging from 100 to 200 mA, resistor R has a value ranging from 6Ω to 3Ω.

Avalanche diodes z1 and z2 are disposed between ground and terminal A or B. In a practical embodiment, as disclosed hereinafter, the avalanche diodes z1 and z2 are connected in series to diodes d1 and d2 having an opposite polarity, respectively. Thus, for example, when a positive overvoltage occurs at terminals A and B, the avalanche diode z2 becomes conductive, and when a negative overvoltage occurs at terminals A and B, the avalanche diode z1 becomes conductive. The avalanche diodes are designed with relation to thyristors Th1 and Th2 so that the triggering of the avalanche diode z1 causes the conduction of thyristor Th1, and the triggering of the avalanche diode z2 causes the conduction of thyristor Th2. Thus, the avalanche diodes z1 and z2 do not pass high currents since the overloads are conducted by thyristors Th1 and Th2. The avalanche diodes z1 and z2 can therefore be small-size diodes.

An embodiment of the present invention provides a component having metallizations corresponding to terminals A, A', B, B', C, C', G and $V_{BAT}$ and monolithically integrating the elementary components illustrated in FIGS. 2 and 3–4.

Figure 5:
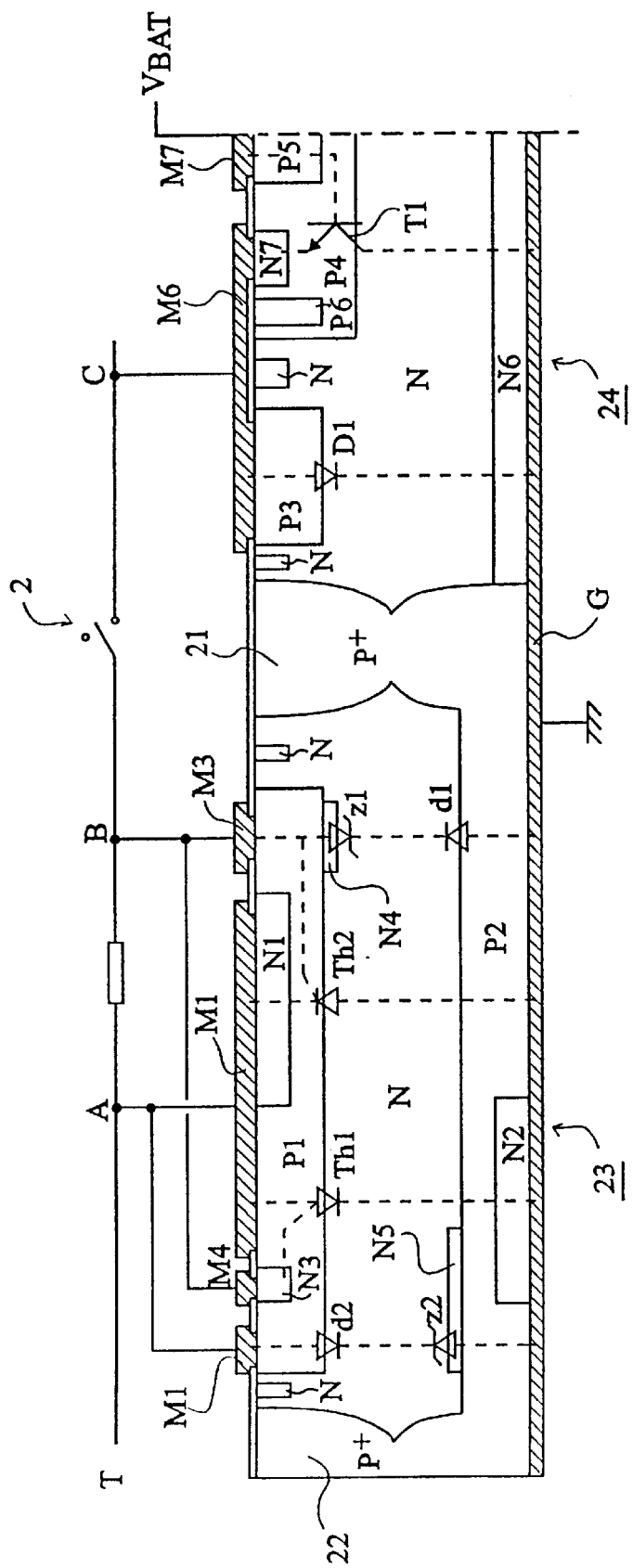
FIG. 5 is a cross-sectional view of a half monolithic semiconductor component according to the invention achieving all the protection functions of a SLIC.

FIG. 5 is a schematic cross-sectional schematic view of one half of the component according to the invention. As usual when schematically representing semiconductor components, the thickness and size of the various semiconductor layers and regions are not drawn to scale. FIG. 5 shows the approximate positions of the various elementary components for comparison with the circuits illustrated in FIGS. 2–4.

The component according to an embodiment of the invention is formed from a substrate having a first conductivity type which is assumed hereinafter to be the N-type. A single metallization G coats the bottom surface. The component is partitioned into two portions 23 and 24 by a P-type isolation wall 21 and is preferably surrounded by an isolation wall 22. The portion 24 is preferably the middle portion corresponding to FIG. 2.

The portion 23 of FIG. 5 will first be described.

In the upper surface of the substrate is formed a P-type well P1, in the lower surface of the substrate is formed a P-type layer P2. An N-type region N1 is formed in substantially one half of the surface of well P1, an N-type region N2 is formed in substantially one half of the surface of layer P2, to substantially complement the first half. In addition, a distinct N-type region N3 is formed in region P1 facing a portion of region N2 that is formed in the opposite surface. A highly doped N-type region N4 is formed at the interface between region P1 and substrate N, substantially beneath the gate contact region of thyristor Th1 corresponding to regions N1-P1-N-P2. A highly doped N-type region N5 is formed at the interface between region P2 and substrate N above a portion of region N2. A metallization M1 coats practically all the area of the upper surface of regions N1 and P1. A metallization M3 coats a small portion of region P1, near region N1 and above the above-mentioned region N4. A metallization M4 coats region N3. The metallization M1 is connected to terminal A and metallizations M3 and M4 to terminal B.

Outside the areas where they cover semiconductor regions, the metallizations lie over non-referenced thin insulating layers (conventionally thin silicon oxide layers). Preferably, a highly doped N-type ring acting as a stop channel is disposed in the substrate at the external periphery of well P1.

The portion 23 of the component according to the invention incorporates the following elementary components:

a vertical thyristor Th1 formed by layers P2-N-P1-N1, whose anode corresponds to metallization G, whose cathode corresponds to metallization M1, and whose gate corresponds to metallization M3;

a vertical thyristor Th2 formed by layers P1-N-P2-N2, whose anode corresponds to metallization M1, and whose cathode corresponds to metallization G, thus, thyristor Th2 is parallel, head-to-tail, connected to thyristor Th1 (thyristor Th2 further includes a region N3 which forms its anode gate);

an avalanche diode z1 corresponding to junction P1-N4, whose anode corresponds to metallization M3 and whose cathode corresponds to metallization G (this avalanche diode z1 is in series with a diode d1 corresponding to junction N-P2); and an avalanche diode z2 corresponding to junction P2-N5, whose anode corresponds to metallization G and whose cathode corresponds to metallization M1 (this avalanche diode z2 is in series with a diode d2 corresponding to junction P1-N).

Figure 5A:
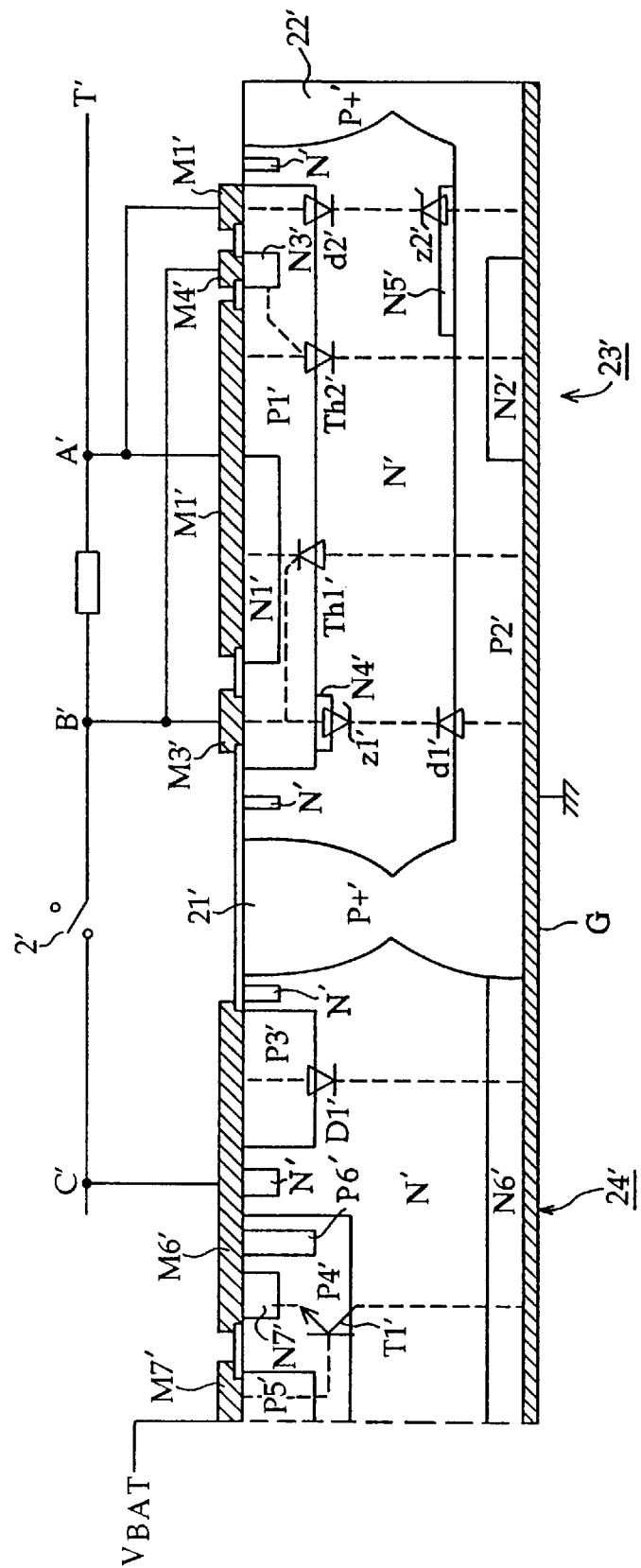
FIG 5a is a cross-sectional view of the other half monolithic semiconductor component not shown in FIG. 5.

The portion 23 of FIG. 5 corresponds to the equivalent diagram illustrated in FIG. 4. Elementary components Th'1, Th'2, z'1, z'2, d'2 that are connected to terminals A' B' and G are achieved in the same way and occupy, for example, a symmetrical surface of the substrate without being separated from the above-mentioned elements by an isolation wall as shown in FIG. 5a.

This device operates as follows:

When the relay switches 2 are turned off and an overvoltage negative with respect to ground occurs across terminals A and B, the avalanche diode z1 avalanches and carriers are generated near the junction P1-N. As a consequence, the thyristor Th1 becomes conductive and the overvoltage is drawn to ground through this thyristor Th1.

When the relay switches 2 are turned off and an overvoltage positive with respect to ground occurs across terminals A and B, the avalanche diode z2 avalanches. This avalanching creates carriers near the junction N-P2 of thyristor Th2 and this thyristor becomes conductive.

When the relay switches 2 are turned on and a negative overcurrent occurs on the line, a positive voltage occurs between terminal B and terminal A. When this voltage reaches approximately 0.7 volt, a gate current flows in junction P1-N1, and the cathode gate thyristor Th1 is conventionally triggered.

When the relay switches 2 are turned on and a positive overcurrent occurs on the line, a positive current flows from terminal A to terminal B, and a positive voltage occurs between terminals A and B. Thus, junction P1-N3 is forward biased and, as soon as the forward conduction threshold voltage of diode P1-N3 (approximately 0.7 volt) is reached, a current flows in junction P1-N3 and causes the generation of carriers near junction P1-N and this causes thyristor Th2 (P1-N-P2-N2) to trigger.

The general operation of a component according to an embodiment of the invention has been disclosed above. This component must further comply with various sensitivity and symmetry characteristics to suitably achieve its function.

The triggering of thyristor Th1 or Th2 through the avalanche diode z1 or z2 does not raise any particular problem. It will be sufficient to select the doping level of regions N4 and N5 to obtain the desired avalanche voltage, for example 250 volts. In addition, in case of overload when the relay switches are turned-off, at the end of an overload, no voltage is present on the line and the thyristor Th1 or Th2 which is conductive during the overload is naturally triggered off.

The problem is more complex in the case of triggering due to overcurrent, because the device must comply with three constraints.

The first constraint is that the thyristors must trigger when a predetermined current flows in resistor R, for example a current of approximately 200 mA. To obtain this result, the gate current to render the thyristors conductive should be low with respect to the current in resistor Rd, for example, approximately 20 mA. As a result, thyristors Th1 and Th2 must be relatively sensitive.

The second constraint is that the device should be as symmetrical as possible, i.e., the device must trigger at approximately the same positive and negative overcurrent thresholds.

The third constraint occurs in particular to the case in which the device is designed to protect a telephone line. In that case, when the relay switches are turned on, a voltage of approximately −48 volts is permanently present on the ring terminal (R) with respect to terminal G. The thyristor (Th1 or Th'1), whose anode corresponds to terminal G and whose cathode corresponds to the ring terminal, must be able to turn off again when a voltage of 48 volts is present between these terminals. This does not raise any critical problem for thyristor Th1 or Th'1 because resistor Rd is connected in series with the thyristor and the constraint on the hold current of the thyristor is in practice moderate. In contrast, referring to FIG. 5, a spurious thyristor P2-N-P1-N3 is also provided, the anode of which corresponds to terminal G and the cathode of which to terminal B. The terminal B is directly connected to the −48 volt-voltage. Thus, the spurious thyristor P2-N-P1-N3 should have a high hold current in order to not remain conductive at the end of the overload.

As described in FR-A-94/05925, is possible to comply with these three constraints by suitably selecting the surfaces of the various layers, the arrangements of the gate regions, and the densities of the emitter short-circuit holes formed through regions N1 and N2. It should be noted that the means used to comply with these constraints are perfectly compatible with the achievement of portion 24 of the component.

The portion 24 of FIG. 5 will now be described.

In portion 24, the bottom surface of substrate N includes a highly-doped N-type layer N6. The upper surface includes a relatively highly-doped P-type well P3, and a lower doped P-type half-well P4. A highly-doped N-type region N7, and a highly-doped P-type half region P5 are formed in well P4.

On the upper surface, a metallization M6 contacts the well P3 and region N7, and a metallization M7 contacts region P5.

Metallizations G, M6, and M7 are designed to be connected to ground, to terminal C, and to the negative voltage $V_{BAT}$, respectively. Between metallizations M6 and G are connected a diode D1, whose anode corresponds to well P3 and whose cathode corresponds to the substrate, and an NPN transistor T1, whose emitter corresponds to region N7, whose base corresponds to well P4 and whose collector corresponds to substrate N. Metallization M7 corresponds to the common bases of transistors T1 and T2. The portion 24 is duplicated with respect to the axis located on the right portion of FIG. 5 to provide diode D2 and transistor T2 which has a common base with transistor T1.

As is apparent to those skilled in the art various modifications can be made to the above-disclosed preferred embodiment.

Although the conductivity types of all the layers can be inverted, it is preferred to use the illustrated structure in which the substrate is of the N-type to ensure a suitable trade-off between sensitivity and the above hold current.

Preferably, a highly-doped N-type ring having a stop-channel function is disposed in the substrate at the external periphery of wells P3 and P4. Also, a highly-doped P-type ring P6 having a stop-channel function is disposed in the inner periphery of well P5.

In this component, the substrate N is selected so that its resistivity is as low as possible in order to minimize the peak-on overvoltage of diodes D1 and D2 which are formed by junctions P3-N and the symmetrical structure. This allows the realization through diffusion (or implantation/diffusion) of a low-doped P⁻ well P4 and thereby a high gain for the NPN transistors.

The doping of well P4 is, for example, selected with a surface concentration $C_s$ ranging from 1 to $5.10^{15}$ atoms/cm³, the junction depth ranging from approximately 30 to 40 μA. An emitter/base breakdown voltage ($B_{VBE}$) of approximately 80 to 150 volts is then obtained while maintaining a high gain (50 to 150).

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A monolithic component for protecting a SLIC, the component comprising:
    an N-type substrate;
    a first uniform metallization coated on a bottom surface of the N-type substrate;
    a first portion formed in the substrate including:
        two vertical diodes having a common cathode corresponding to the bottom surface of the substrate; and
        two vertical transistors having a common collector and a common base, the collectors corresponding to the bottom surface of the substrate;
    a second portion formed in the substrate including:
        a first pair of head-to-tail parallel-connected vertical thyristors and a first pair of head-to-tail parallel-connected vertical zener diodes that control the conduction of said first pair of thyristors; and
        a second pair of head-to head-to-tail parallel-connected vertical thyristors and a second pair of head-to-tail parallel-connected vertical zener diodes that control the conduction of said second pair of thyristors; and
    a P-type isolation wall that separates the first portion from the second portion.

2. The component of claim 1, wherein a section of the substrate in which the first portion is formed includes:
    a highly doped layer bordering the bottom surface of the substrate, the highly doped layer coated with the first uniform metallization; and the first portion further includes:
    first and second highly doped P-type wells formed in an upper region of the substrate;
    a third low-doped P-type well having first and second N-type regions and a P-type region formed therein;
    a second metallization connecting the first highly doped P-type well to the first N-type region;
    a third metallization connecting the second highly doped P-type well to the second N-type region; and
    a fourth metallization coated on the P-type region.

3. The component of claim 2, wherein each P-type well is surrounded by an N-type ring.

4. The component of claim 1, wherein the component is coupled to a resistor and the second portion further includes:

first, second and third upper surface metallizations, wherein the first upper surface metallization is coupled to a first terminal of the resistor, and the second and third upper surface metallizations are coupled to a second terminal of the resistor;

wherein the first pair of head-to-tail parallel-connected vertical thyristors includes first and second thyristors connected to one another between the first uniform metallization and the first upper surface metallization, wherein each gate of the first and second thyristor is respectively coupled to the second and third upper surface metallizations; and wherein the first pair of head-to-tail parallel connected vertical zener diodes includes:

a first avalanche diode having a first polarity coupled between the first uniform metallization and the second upper surface metallization, wherein conduction of the first avalanche diode causes conduction of the first thyristor; and a second avalanche diode having a second polarity coupled between the first uniform metallization and the first upper surface metallization, wherein conduction of the second avalanche diode causes conduction of the second thyristor.

5. The component of claim 4, further comprising:

a first P-type region formed in an upper region of the substrate;

a second P-type region formed in a lower region of the substrate, wherein the first uniform metallization coats the second P-type region;

a third N-type region formed in the first P-type region, wherein the first upper surface metallization coats the third N-type region and a substantial portion of the first P-type region;

a fourth N-type region formed in the second P-type region, wherein the first uniform metallization coats the fourth N-type region;

a fifth N-type region formed in the first P-type region, wherein the third upper surface metallization coats a portion of the fifth N-type region;

a sixth highly doped N-type region formed adjacent to the first P-type region; and a seventh highly doped N-type region formed adjacent to the second P-type region.

6. The component of claim 5, wherein the firth thyristor is formed by the second P-type region, the N-type substrate, the first P-type region and the third N-type region.

7. The component of claim 6, wherein the second thyristor is formed by the first P-type region, the N-type substrate, the second P-type region, the fourth N-type region, and the fifth N-type region that forms a gate of the second thyristor.

8. The component of claim 7, wherein the first avalanche diode is formed by the sixth highly doped N-type region and the first P-type region.

9. The component of claim 8, wherein the second avalanche diode is formed by the seventh highly doped N-type region and the second P-type region.

10. A monolithic protection component comprising:

a first resistor having first and second terminals;

a first avalanche diode in a first electrical path between the first terminal and ground;

a second avalanche diode in a second electrical path between the second terminal and ground;

a first thyristor having a gate coupled to the second terminal, a cathode coupled to the first terminal and an anode coupled to ground;

a second thyristor having a gate coupled to the second terminal, an anode coupled to the first terminal and a cathode coupled to ground;

a first diode having an anode coupled to the second terminal of the first resistor and a cathode coupled to ground; and a first transistor having an emitter coupled to the second terminal of the first resistor, a collector coupled to ground, and a base coupled to a reference voltage.

11. The protection component of claim 10, further comprising:

a second resistor having first and second terminals;

a third avalanche diode in a third electrical path between the first terminal of the second resistor and ground;

a fourth avalanche diode in a fourth electrical path between the second terminal of the second resistor and ground;

a third thyristor having a gate coupled to the second terminal of the second resistor, a cathode coupled to the first terminal of the second resistor and an anode coupled to ground;

a fourth thyristor having a gate coupled to the second terminal of the second resistor, an anode coupled to the first terminal of the second resistor and a cathode coupled to ground;

a second diode having an anode coupled to the second terminal of the second resistor and a cathode coupled to ground; and a second transistor having an emitter coupled to the second terminal of the second resistor, a collector coupled to ground, and a base coupled to the reference voltage.

12. The component of claim 10, wherein the first resistor is coupled in series with a telephone line.

13. The component of claim 11, wherein the first and second resistors are coupled in series with first and second telephone lines.

14. The component of claim 11, wherein the component is coupled between first and second telephone lines, the first diode and first transistor are coupled to the second terminal of the first resistor via a first switch, and the second diode and the second transistor are coupled to the second terminal of the second resistor via a second switch.

15. The component of claim 10, further comprising:

a substrate having a first conductivity type;

a first region having a second conductivity type formed in an upper region of the substrate and coupled to the first terminal;

a second region having the second conductivity type formed in a lower region of the substrate and coupled to ground;

a third region having the first conductivity type formed in the first region and coupled to the first terminal, wherein the substrate, the first region, the second region and the third region form the first thyristor;

a fourth region having the first conductivity type formed in the second region and coupled to ground;

a fifth region of the first conductivity type formed in the first region and coupled to the second terminal, wherein the substrate, first region, the second region, the fourth region, and the fifth region form the second thyristor;

a sixth highly doped region of the of the first conductivity type formed between the first region and the substrate, wherein the substrate and the sixth region form the second avalanche diode; and a seventh highly doped region of the first conductivity type formed between the substrate and the second region, wherein the substrate and the seventh highly doped region form the first avalanche diode.

16. The component of claim 11, further comprising:

an isolation region of the second conductivity type formed in the substrate that forms an isolated region of the substrate that includes the first diode and the first transistor, wherein the isolated region includes:
 a highly doped layer having the first conductivity type formed in a lower region of the substrate and coupled to ground;
 a first highly doped region of the second conductivity type, wherein the first diode is formed by the first highly doped region, and the substrate;
 a second lightly doped region of the second conductivity type formed in an upper region of the substrate;
 a third region having the first conductivity type formed in the second lightly doped region, the third region forming the emitter of the first transistor, and the substrate forming the collector; and
 a fourth region having the second conductivity type formed in the second region, the fourth region forming the base of the transistor.

17. The component of claim 7, further comprising:

a second diode having an anode coupled to the first terminal and a cathode coupled to the first avalanche diode; and a third diode having an anode coupled to ground and a cathode coupled to the second avalanche diode, wherein the second diode is formed by the substrate and the first region and the third diode is formed by the substrate and the second region.

18. The component of claim 10, further comprising:

a second diode having an anode coupled to the first terminal and a cathode coupled to the first avalanche diode; and a third diode having an anode coupled to ground and a cathode coupled to the second avalanche diode.

* * * * *